United States Patent
Ko et al.

(10) Patent No.: US 9,257,280 B2
(45) Date of Patent: Feb. 9, 2016

(54) MITIGATION OF ASYMMETRICAL PROFILE IN SELF ALIGNED PATTERNING ETCH

(71) Applicant: TOKYO ELECTRON LIMITED, Tokyo (JP)

(72) Inventors: Akiteru Ko, Schenectady, NY (US); Angelique D. Raley, Mechanicville, NY (US); Kiyohito Ito, Fishkill, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/294,278

(22) Filed: Jun. 3, 2014

(65) Prior Publication Data

US 2014/0357084 A1    Dec. 4, 2014

Related U.S. Application Data

(60) Provisional application No. 61/831,011, filed on Jun. 4, 2013.

(51) Int. Cl.
*H01L 21/308* (2006.01)
*H01L 21/33* (2006.01)
*H01L 21/033* (2006.01)
*H01L 21/311* (2006.01)

(52) U.S. Cl.
CPC ........ *H01L 21/0337* (2013.01); *H01L 21/3086* (2013.01); *H01L 21/31144* (2013.01)

(58) Field of Classification Search
None
See application file for complete search history.

(56) References Cited

U.S. PATENT DOCUMENTS

| | | | | |
|---|---|---|---|---|
| 4,855,017 | A * | 8/1989 | Douglas | 438/695 |
| 5,328,810 | A * | 7/1994 | Lowrey et al. | 430/313 |
| 5,648,283 | A | 7/1997 | Tsang et al. | |
| 6,218,196 | B1 * | 4/2001 | Ise et al. | 438/689 |
| 6,277,756 | B1 | 8/2001 | Ohara et al. | |
| 6,755,945 | B2 | 6/2004 | Yasar et al. | |
| 6,875,703 | B1 * | 4/2005 | Furukawa et al. | 438/736 |
| 7,396,781 | B2 | 7/2008 | Wells | |
| 8,835,320 | B2 | 9/2014 | Ozu | |
| 2007/0026677 | A1 * | 2/2007 | Ji et al. | 438/689 |
| 2007/0077715 | A1 * | 4/2007 | Kang et al. | 438/299 |
| 2009/0176375 | A1 * | 7/2009 | Benson et al. | 438/719 |
| 2014/0295668 | A1 * | 10/2014 | Avasarala | 438/696 |
| 2014/0357084 | A1 * | 12/2014 | Ko et al. | 438/696 |
| 2014/0367762 | A1 * | 12/2014 | Tian et al. | 257/321 |
| 2015/0037979 | A1 * | 2/2015 | Hudson | 438/694 |

OTHER PUBLICATIONS

International Search Report and Written Opinion mailed Oct. 15, 2014 in PCT/US2014/040277 (15 pages).

* cited by examiner

*Primary Examiner* — Allan Olsen
(74) *Attorney, Agent, or Firm* — Rothwell, Figg, Ernst & Manbeck, P.C.

(57) ABSTRACT

A method which is particularly advantageous for improving a Self-Aligned Pattern (SAP) etching process. In such a process, facets formed on a spacer layer can cause undesirable lateral etching in an underlying layer beneath the spacer layer when the underlying layer is to be etched. This detracts from the desired vertical form of the etch. The etching of the underlying layer is performed in at least two steps, with a passivation layer or protective layer formed between the etch steps, so that sidewalls of the underlying layer that was partially etched during the initial etching are protected. After the protective layer is formed, the etching of the remaining portions of the underlying layer can resume.

13 Claims, 3 Drawing Sheets

MITIGATION OF ASYMMETRICAL PROFILE IN SELF ALIGNED PATTERNING ETCH

CROSS REFERENCE TO RELATED APPLICATIONS

This application claims priority to Provisional Application No. 61/831,011 filed Jun. 4, 2013, the entirety of which is incorporated herein by reference.

FIELD OF THE INVENTION

The invention relates to improved etching methods. The invention can be particularly advantageous in etching with Self-Aligned Patterning (SAP) techniques.

BACKGROUND OF THE INVENTION

Techniques herein relate to semiconductor device fabrication. Self-Aligned Patterning (SAP) is a known technique for decreasing feature sizes on semiconductor substrates. Due to the semi conformal nature of spacer materials, however, SAP techniques can lead to undesirable bowing of underlying layers. Techniques herein address such bowing by providing a technique to protect underlying layers while maintaining critical dimensions.

In a typical SAP method, a spacer layer is formed upon mandrels, the top portion of the spacer layer is removed, and then the mandrel is removed, thereby leaving spaced portions of the spacer layer upon an underlying layer. The underlying layer is then etched between the portions of the spacer layer. However, the spacer layer can often have facets, for example, curved or inclined portions. When the underlying layer is subsequently etched, ions deflect from such facets and can impinge upon sidewalls of the underlying layer. As a result, the sidewalls are etched, and the desired vertical profile for etching of the underlying layer is not achieved.

SUMMARY OF THE INVENTION

The invention provides an improved etching method which is particularly advantageous when used with SAP techniques. Typically, when etching an underlying layer underneath a spacer layer, the underlying layer is etched to the complete depth of the etch in one etching step. In accordance with an example of the invention, a first portion of the underlying layer is etched followed by the deposition or growth of a protective layer on the sidewalls of the partially etched underlying layer. After the protective layer is formed, the remainder of the depth of the underlying layer is then etched. The protective layer thereby prevents or reduces lateral etching in the sidewalls of the underlying layer, so that bowing is avoided or minimized, and a more vertical etch is achieved.

In accordance with a preferred example, after the first portion of the underlying layer is etched, etching is discontinued, followed by formation of the protective layer. The protective layer can be formed not only on the sidewalls of the partially etched underlying layer, but also on bottom surfaces. Therefore, in accordance with an example, when etching begins again, a breakthrough etch step can be first performed followed by continuing of etching through to the remainder of the depth of the underlying layer. In the breakthrough etch, the etching conditions can be modified to be more advantageous in etching through the protective layer on the bottom surface of the trench in the partially etched underlying layer. For example, the pressure can be decreased and/or the etch chemistry can be modified.

The initial etching, protective layer forming, and then the continued etching or completion of etching of the remainder of the underlying layer, can be formed in the same process chamber, with a plasma continuously maintained throughout the process. For example, the process chemistry can be varied so that after the initial etching of the underlying layer, the etching is discontinued and the process chemistry or plasma chemistry is changed so that the protective layer is deposited or grown, and thereafter, the process chemistry can be again changed (e.g., back to that used for the initial etching) so that etching resumes to etch the remainder of the underlying layer, with a plasma maintained throughout the process. Alternately, the plasma can be extinguished after each of the steps, and then resumed for the next step. By way of example, and not to be construed as limiting, maintaining a plasma continuously throughout the process will typically be desirable for production of commercial products. However, discontinuing or extinguishing of the plasma might be desirable, for example, during process development.

By way of example, the etching of the first portion of the underlying layer and the etching of the remaining portion of the underlying layer can use the same process gas chemistry, because the material of the underlying layer is the same. As noted above, when the etching initially resumes after deposition or growth of the protective layer, the process gas chemistry could also be modified during breakthrough of the protective layer on the bottom wall of the partially etched underlying layer. Because the etching is highly directional with vertical ions, this modification during breakthrough etching is optional.

The invention will be better appreciated with reference to the detailed description of examples of embodiments herein. It is to be understood that the examples can be modified, and that certain features or combinations of features can be utilized without utilizing other features. Thus, the invention could be practiced using subsets of features or advantages of the disclosed examples, or with modifications to suit particular materials or processes to which the invention can be applied. In addition, it is to be understood that, unless specified, the sequence of steps of the invention could also be modified or could overlap with one another, or could include additional steps.

DETAILED DESCRIPTION OF PREFERRED EMBODIMENTS

Figures 1A, 1B:
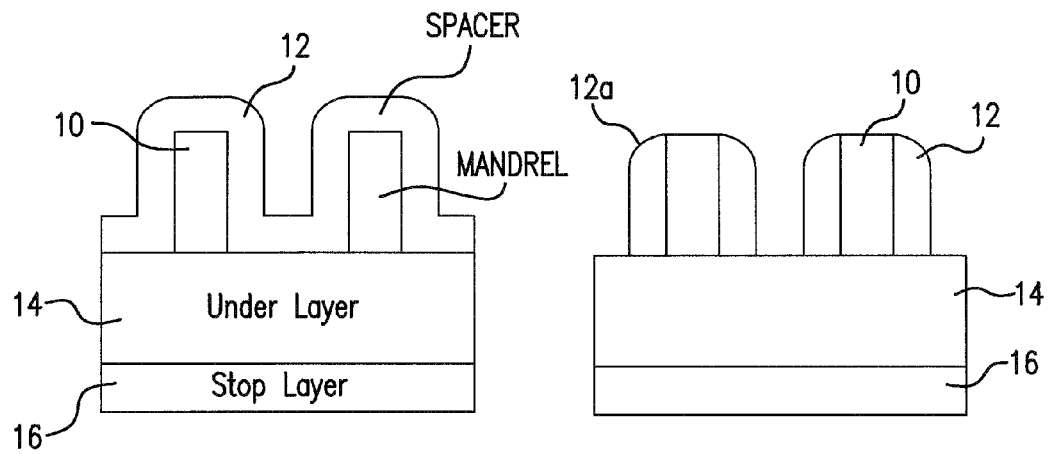
FIGS. 1A and 1B illustrate forming and etching of a spacer layer in a conventional SAP process.
Figures 2A, 2B:
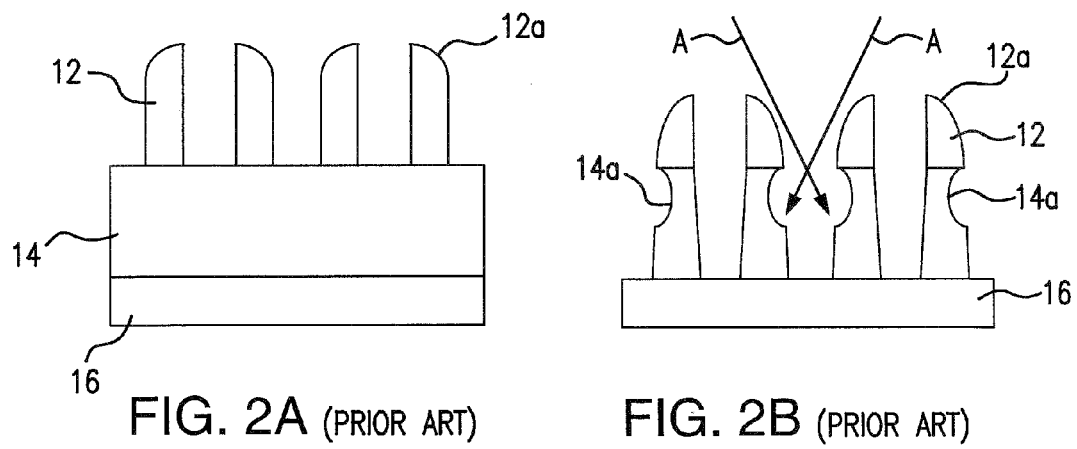
FIGS. 2A and 2B illustrate mandrel removal and etching of an underlying layer in a conventional SAP process.

FIGS. 1A-B and 2A-B show a conventional self-aligned patterning (SAP) process and accompanying drawbacks. For such patterning, a mandrel 10 can be used as a core, and then a spacer layer 12 is deposited over the mandrel core. The mandrel and spacer layer are deposited on an underlying layer 14. During deposition and/or spacer etch—prior to removal of the mandrel—the spacers can result in a faceted surface 12a on one side (the side that is not adjacent to the mandrel). This can be curved, angled, or otherwise not parallel to an opposing side. In FIG. 2A, with the mandrel removed, the faceted portions 12a of the spacer can be easily distinguished. Such faceting can be undesirable during a subsequent underlayer etching process. During an underlayer etch, the faceted spacer/mask can cause ions, radicals, or other species to be deflected and strike sidewalls of the underlying layer as represented by arrows A in FIG. 2B. This is undesirable because such deflected ions laterally etch the underlying layer, resulting in bowing. The undercut or bowing is primarily on the non-mandrel side, while the mandrel side (i.e., the sidewall surfaces adjacent to where the mandrel was located) has relatively little or no bowing.

In accordance with the invention, a method of self-aligned pattern etching is provided that reduces bowing of an underlying layer in the presence of a faceted spacer. Such techniques include executing a partial etch, followed by a sidewall protection step to protect the partially etched underlying layer, and then an etch of the remaining underlying layer. Note that various different types of materials and etch/protection chemistries can be used. For convenience, techniques herein will identify certain specific examples of materials. For example, the spacer layer 12 can comprise silicon oxide (SiO2), the underlying layer 14 can be silicon, and the substrate (or a further layer beneath the underlying layer) 16 can be silicon oxide or silicon nitride or other material.

The mandrel 10 is formed by conventional techniques, for example, by depositing a layer of the mandrel material and then etching the layer so that a plurality of mandrels remain upon the substrate. Thereafter, the spacer material is formed upon the mandrel, portions of the spacer material are etched, and the mandrel is then removed, for example, by etching as discussed previously with respect to FIGS. 1A-B and 2A.

Referring to FIGS. 3A-D, a substrate is provided or received having a spacer layer 112 (mandrel removed), an underlying layer 114, and a substrate or further layer 116. This substrate stack includes faceted/angled sidewalls 112a of spacers 112. Using the spacers in the spacer layer as a mask, a top portion of the underlying layer is etched as show in FIG. 3B. This partial etch can be executed by using an etch chemistry that is selective to the underlying layer relative to the spacers. After the partial etch, a protection layer 115 can be deposited and/or grown on the now created sidewalls (114a) of the underlying layer 114. By way of a non-limiting example, when the underlying layer is silicon, then the deposited/grown protection layer can be silicon dioxide formed, for example, with an oxygen plasma. Thus, an oxidation step can be used for creating a protection layer. After silicon dioxide is protecting upper sidewalls of the underlying layer, then an etch step can be continued that etches the underlying layer 114 down to the substrate or target layer 116 below.

As mentioned, various chemistries and protection layers can be selected based on particular material compositions of the various layers. For example, if the underlying layer 114 is a nitride, then a fluorocarbon chemistry can be used to create a protection or passivation layer 115. When the underlying layer 114 is an organic layer, then corresponding chemistries can be used that resist etching the mask (112, 115) while etching the underlying layer. Also note that the invention is not limited to a partial etch followed by a single deposition, which is then followed by a full/remaining etch. For example, there can be several etch/deposition/etch cycles for a particular application.

The amount of etching of the underlying layer 114 before forming a protective or passivation layer can vary depending upon the materials and the depth to be etched. However, preferably the passivation or protective layer 115 is deposited when there has been an initial etch of 50% or less of the total depth to be etched.

After the first etching or initial etching, a trench is formed in the layer 114 having both sidewalls 114a and a bottom wall 114b in the trench. When the protective layer is formed, it typically will be formed on both the sidewalls 114a and bottom walls 114b of the trench of the partially etched underlying layer, with respective protective layer portions 115a and 115b. The portion 115b on the bottom wall 114b of the underlying layer 114 must therefore be etched through before continuing to etch the remaining portions of the underlying layer 114. Preferably, the etching of the underlying layer 114 is conducted using a low pressure, for example, 1-100 mTorr which produces ions that are highly directional, so that the protective layer 115b at the bottom of the trench can be etched through while the protective layer portion 115a is sufficient to protect the sidewalls 114a with respect to deflected ions.

To further assist in etching through or breaking through the portion 115b, the process can optionally be modified for a breakthrough etch of the portion 115b, and thereafter, the etching of the remaining portions of the underlying layer 114 can resume (e.g., with the same plasma chemistry and conditions as used in the initial underlying layer partial etch). For example, the pressure and/or etch chemistry can be modified during the initial etching after the protective layer 115 has been formed to further assist in etching through the bottom portion 115b of the protective layer. As noted earlier, the plasma processing is preferably conducted at low pressure. During the deposition or growth of the protective layer, the pressure can be slightly higher than that used during etching of the underlying layer, as a slightly higher pressure is beneficial for formation or growth of the protective layers (during the deposition or growth of the protective layer 115, the pressure remains low, for example, in the 1-100 mTorr range, however the pressure is preferably slightly higher than the pressure used during etching). During the etching through the bottom portion 115b, the pressure is again reduced, and is preferably lower than the pressure used for the deposition/growth of the protective layer. This reduced pressure for etching through the bottom portion 115b can be the same as or could be slightly lower than the pressure used for etching the remainder of underlying layer 114. In addition, the etch chemistry for etching portion 115b can be modified as compared with the etch chemistry used for the remaining portion of the underlying layer 114. For example, during the etching of the bottom portion 115b, fluorine or a fluorine containing gas, such as $CF_x$ or $C_xF_y$, could be utilized, and thereafter, the gas chemistry can be changed back to the gas chemistry utilized for etching the underlying layer 114. The gas chemistry used for etching the underlying layer 114 can be the same in the initial etching and for etching of the final or remaining portions of the underlying layer 114.

The plasma chemistry will depend upon the materials of the underlying layer being etched, however, by way of example, and to not be construed as limiting, an HBr or Cl plasma can be used for etching the underlying layer. By way of example, and not to be construed as limiting, the initial etching of the underlying layer can proceed for about 20-40 seconds, with the deposition or passivation forming/growth then proceeding for 2-30 seconds, followed by a breakthrough etch (to etch the portion 115b) of approximately 2-10 seconds, with the final or remaining etch proceeding for approximately 30-60 seconds. As noted earlier, rather than providing a two-step etch of the underlying layer with one deposition/growth in between, multiple cycles of alternating etching and protective layer forming at steps could be utilized.

Figure 3A:
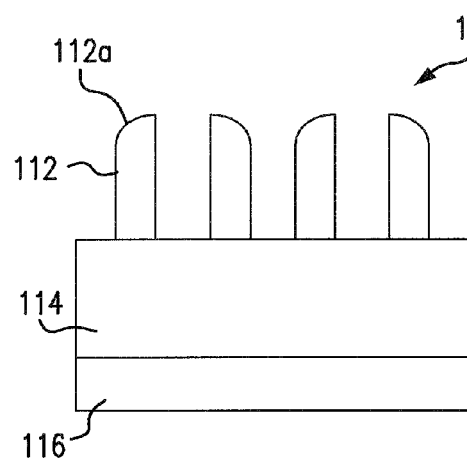
FIGS. 3A-3D illustrate an example of etching in an SAP process of the invention.
Figure 3B:
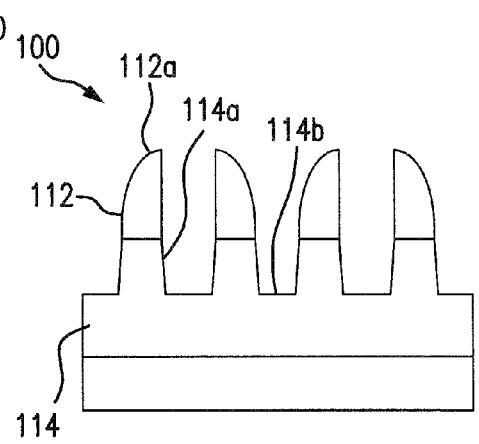
Figure 3C:
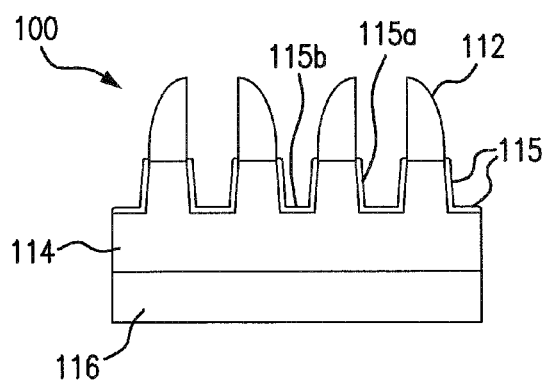
Figure 3D:
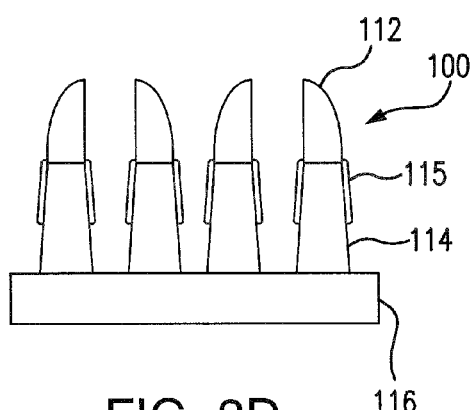

Beneath the underlying layer 114, the substrate 116 or substrate layers 116 are illustrated. Various layers 116 could be present underneath the underlying layer 114. The target layer 116 can serve as an etch stop layer so that once the underlying layer 114 is etched fully through, the etching discontinues. By way of example, the layer 116 can be SiO or SiN. Of course, various layers can also be present underneath the layer immediately below the underlying layer 114. The layer or substrate 116 could be the silicon wafer substrate or substrate base itself. The layer 116 could also be a layer or substrate that is subsequently etched using the underlying layer 114 as a mask. For example, the underlying layer 114 could be formed of a mask material so that, after the etching of the underlying layer 114, the underlying layer 114 (e.g., as shown in FIG. 3B) provides a mask for subsequent etching of the substrate 116, with the etching of the substrate 116 (or other layer present beneath the underlying layer 114) proceeding in the spaces or apertures formed between the portions of the underlying layer 114 remaining upon the substrate 116.

As noted earlier, according to an example, the spacer layer 112 can be $SiO_2$, and it can serve as a mask for the etching of the underlying layer 114 which can be, for example, Si. An oxygen plasma can then be used for forming the protective layer 115 so that the protective layer is, for example, a silicon oxide. It is to be understood that alternate materials can be utilized, or in other words, the present invention could also be utilized or applied to configurations or architectures in which alternate materials are used. For example, the spacer or mask layer 112 could be a silicon nitride material. The protective layer can be SiO, or a polymer or fluorocarbon such as $C_xH_y$, or a silicon coating, for example, formed with an SiCl plasma. Beneath the underlying layer, the layer 116 can be, for example, SiN or SiO. For etching the underlying layer, by way of example, a $C_xF_y$ can be used for the initial etching and for completion of etching of the underlying layer. If desired to use a different chemistry or different gas for the breakthrough of the portion 115b a leaner gas (less polymer) could be used during the breakthrough, followed by resuming of etching with the same gas chemistry for etching the remaining portions of the underlying layer 114 as was used for etching the initial portions of the underlying layer.

Further by way of example, the spacer or mask layer 112 can also be or include a carbon material, an oxide, or nitride, and the underlying layer can be a carbon material such as an OPL (organic planarization layer), and for protection after the initial etch, a polymer or silicon polymer can be formed on the sidewall of the underlying layer. For etching of the underlying layer, an oxygen based plasma, CO, $CO_2$, or COS plasmas can be utilized. In addition, if desired, to assist in breakthrough of the bottom portion 115b of the protective layer, additional $C_xF_y$ could be utilized for etching through the bottom portion 115b, followed by resumption of etching with the same gas chemistry as used during the etching of the initial portion of the underlying layer 114.

Figure 4:
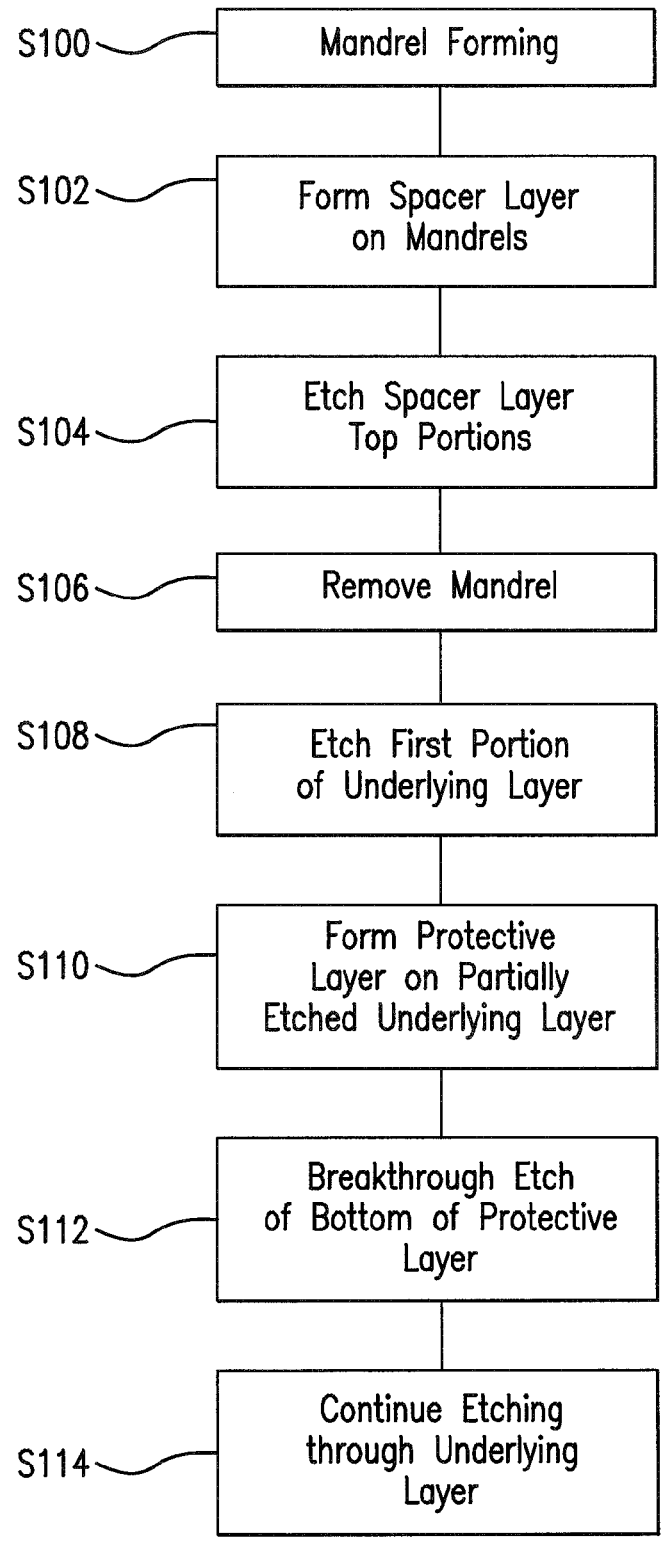
FIG. 4 is a flowchart representing an example of a process of the invention.

FIG. 4 is a flowchart representing the process of the invention. As shown in step S100, mandrels are first formed, for example by etching a layer of the mandrel material to leave mandrels on the underlying layer. After the mandrels are formed, in step S102, a spacer layer is formed on the mandrels, followed by etching of the top portions of the spacer layer in step S104. Thus, after step S104, the spacer layer is present along the sidewall surfaces of the mandrels, but the top of the mandrel is exposed, so that the mandrels can be removed in step S106, for example, by etching. In step S108, the first portion of the underlying layer is etched, followed by formation of the protective layer on the partially etched underlying layer in step S110. Thereafter, a breakthrough etch can be performed in step S112. As discussed earlier, the modification of the etching process for the breakthrough etch is optional, and the same etch process as used for etching the underlying layer could also be used to etch through the bottom portion 115b of the protective layer. To further assist etching through of the bottom portion of the protective layer, a breakthrough etch step can be performed in which, for example, the pressure is reduced and/or the etch chemistry modified (for example, with a leaner or lower amount of polymer, or with an additional fluorine containing gas) to assist in the etching through the protective layer bottom portion 115b. Thereafter, etching continues to etch through the underlying layer as indicated in step S114. As also discussed earlier, the initial etching, formation of the protective layer, the optional breakthrough etching, and the completion of etching through the underlying layer can be performed in the same process chamber with a plasma maintained continuously throughout, and with the etch chemistry or other processing conditions modified for performing the various steps. Alternatively, the plasma can be extinguished after one or more of the various steps, and then a plasma is re-struck for the next step.

In the preceding description, specific details have been set forth. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Operations described may be performed in a different order than the described embodiments unless otherwise specified. Various additional operations may be performed and/or described operations may be omitted in additional embodiments.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting upon the scope of the following claims.

The invention claimed is:

1. A method for self-aligned pattern etching, the method comprising:
   providing a substrate having spacers formed on a sidewall of one or more mandrels, wherein the spacers are formed on an underlying layer, and the spacers are formed of a first material, and wherein the underlying layer is formed of a second material;
   removing the one or more mandrels, such that the resulting spacers have a cross sectional shape in which a first sidewall is relatively planar and a second sidewall, on an opposite side of a respective spacer, is faceted having a non-planar surface;
   etching a first portion of the underlying layer using the spacers as a mask;
   depositing or growing a protective layer on sidewalls of the underlying layer created during etching of the first portion; and
   etching a remaining portion of the underlying layer using the spacers as a mask;
   wherein the etching of the first portion and the etching of the second portion are performed by plasma etching;
   wherein etching is stopped during the depositing or growing of the protective layer;

wherein during the depositing or growing of the protective layer upon the sidewalls that are formed during the etching of the first portion, the protective layer is also deposited on a bottom wall of the underlying layer, and wherein the method further comprises performing a breakthrough etch to etch through the protective layer on the bottom wall of the underlying layer; and wherein during the breakthrough etch, both:
(a) a plasma gas chemistry is used which is different than a plasma gas chemistry used during etching of the remaining portion of the underlying layer; and
(b) a pressure in a processing chamber is reduced compared to a pressure used during the depositing or growing of the protective layer.

2. A method as recited in claim 1, wherein during at least a portion of the etching of the remaining portion of the underlying layer a plasma gas chemistry is used which is the same as a plasma gas chemistry used during at least of portion of the etching of the first portion.

3. A method as recited in claim 2, wherein one of a further layer or a substrate is positioned directly under said underlying layer, and further wherein during the etching of the remaining portion of the underlying layer said one of the further layer or the substrate is exposed.

4. A method as recited in claim 3, wherein during the etching of the first portion, a depth of the underlying layer is etched which is less than 50% of a total depth etched of said underlying layer in both the etching of the first portion and the etching of the remaining portion.

5. A method as recited in claim 1, wherein during the etching of the first portion, a depth of the underlying layer is etched which is less than 50% of a total depth etched of said underlying layer in both the etching of the first portion and the etching of the remaining portion.

6. A method as recited in claim 1, wherein the depositing or growing of the protective layer is performed with an oxygen plasma.

7. A method for self-aligned pattern etching comprising:
providing a substrate having a layer of mandrel material thereon and an underlying layer under the layer of mandrel material;
etching portions of the layer of mandrel material to form a plurality of mandrels on the underlying layer;
depositing a spacer layer on the plurality of mandrels so that the spacer layer is formed on at least top and sidewalls of the plurality of mandrels;
etching a top portion of the spacer layer so that the plurality of mandrels are exposed while portions of the spacer layer remain along the sidewalls of the plurality of mandrels;
removing the plurality of mandrels, wherein after the plurality of mandrels are removed, portions of the underlying layer are exposed and the spacer layer provides a mask over other portions of the underlying layer;
etching a first portion of the underlying layer using the spacer layer as a mask to form a partially etched underlying layer;
depositing or growing a protective layer on sidewalls of the partially etched underlying layer; and
after depositing or growing the protective layer, continuing etching of the underlying layer to etch a second portion of the underlying layer;
wherein during the depositing or growing of the protective layer, the protective layer is also deposited on a bottom wall of the underlying layer, and wherein the method further comprises performing a breakthrough etch to etch through the protective layer on the bottom wall of the underlying layer; and
wherein during the breakthrough etch, both:
(a) a plasma gas chemistry is used which is different than a plasma gas chemistry used during continuing etching of the underlying layer; and
(b) a pressure in a processing chamber is reduced compared to a pressure used during the depositing or growing of the protective layer.

8. A method as recited in claim 7, wherein the etching of the first portion of the underlying layer etches less than 50% of a total depth etched of the underlying layer.

9. A method as recited in claim 8, wherein one of a further layer or a substrate base is disposed immediately beneath the underlying layer, and wherein the underlying layer is etched completely through to expose portions of the further layer or substrate base.

10. A method as recited in claim 7, wherein each of the etching of the first portion, the depositing or growing of the protective layer, and the continuing etching are performed with a plasma maintained in a process chamber, and wherein during the depositing or growing of the protective layer an oxygen plasma is used to form an oxide layer on sidewalls of the partially etched underlying layer.

11. A method as recited in claim 10, wherein a plasma chemistry used during the etching of the first portion is the same as a plasma chemistry used during continuing etching of the underlying layer.

12. A method as recited in claim 7, wherein etching is stopped during the depositing or growing of the protective layer.

13. A method as recited in claim 12, wherein the depositing or growing of the protective layer is performed with an oxygen plasma.

* * * * *